US 7,051,239 B2

(12) United States Patent
Litt

(10) Patent No.: US 7,051,239 B2
(45) Date of Patent: May 23, 2006

(54) METHOD AND APPARATUS FOR EFFICIENTLY IMPLEMENTING TRACE AND/OR LOGIC ANALYSIS MECHANISMS ON A PROCESSOR CHIP

(75) Inventor: Timothe Litt, Southborough, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 658 days.

(21) Appl. No.: 10/034,717

(22) Filed: Dec. 28, 2001

(65) Prior Publication Data
US 2003/0126508 A1 Jul. 3, 2003

(51) Int. Cl.
*G06F 11/00* (2006.01)
(52) U.S. Cl. .............................. 714/42; 714/30; 714/33; 714/41
(58) Field of Classification Search .................. 714/30, 714/33, 42, 41
See application file for complete search history.

(56) References Cited

U.S. PATENT DOCUMENTS

| 6,618,775 | B1 * | 9/2003 | Davis .......................... 710/100 |
| 6,704,895 | B1 * | 3/2004 | Swoboda et al. ............ 714/726 |
| 6,742,145 | B1 * | 5/2004 | Bailey et al. .................. 714/42 |
| 6,772,369 | B1 * | 8/2004 | Smith et al. ................... 714/31 |

* cited by examiner

*Primary Examiner*—Scott Baderman
*Assistant Examiner*—Timothy M Bonura

(57) ABSTRACT

A system is disclosed in which an on-chip logic analyzer (OCLA) is included in an integrated circuit, such as a microprocessor. During debug modes, one or more sets of an on-chip cache memory are disabled from use by other circuitry in the integrated circuit, and reserved exclusively for use by the OCLA. Data stored in the reserved cache set can then be read out by the OCLA, and placed in a register that can be accessed by other logic internal or external to the integrated circuit. If the integrated circuit is operating under normal mode, the cache memory set can be used in conventional fashion by other circuitry with in the integrated circuit to enhance performance.

22 Claims, 5 Drawing Sheets

METHOD AND APPARATUS FOR EFFICIENTLY IMPLEMENTING TRACE AND/OR LOGIC ANALYSIS MECHANISMS ON A PROCESSOR CHIP

CROSS-REFERENCE TO RELATED APPLICATIONS

Method And Apparatus For Managing Timestamps When Storing Data, Ser No. 10/034,462, filed Dec. 28, 2001; An Efficient Word Recognizer For A Logic Analyzer Ser No. 10/034,227 filed Dec. 28, 2001; and Method And Apparatus For Implementing Loop Compression In A Program Counter Traces, Ser. No. 10/034,506, filed Dec. 28, 2001. now U.S. Pat. No. 6,691,207 B2 issued Feb. 10, 2004;

all of which are incorporated by reference herein.

STATEMENT REGARDING FEDERALLY SPONSORED RESEARCH OR DEVELOPMENT

Not applicable.

BACKGROUND OF THE INVENTION

1. Field of the Invention

The present invention relates generally to the design of digital logic devices. More specifically, the present invention relates to the design of digital logic devices, which include on-chip memory, to facilitate debugging and testing of such devices. Still, more particularly, the invention relates to an on-chip logic analyzer, which operates in conjunction with a portion of on-chip cache memory to support on-chip storage of debug and performance data.

2. Background of the Invention

The design and development of digital logic circuits has become increasingly complex, due in large measure to the ever-increasing functionality offered in such circuits. Integrated circuits are constantly surpassing milestones in performance, as more and more functionality is packaged into smaller sizes. This enhanced functionality requires that a greater number of transistors be included in an integrated circuit, which in turn requires more rigorous testing to insure reliability once the device is released. Thus, integrated circuit designs are repeatedly tested and debugged during the development phase to minimize the number and severity of errors that may subsequently arise. In addition, chips may be tested to determine the performance characteristics of the device, including the speed or throughput of the chip, software running on the chip, or the aggregate performance of the system.

As integrated circuits become more complex, the length of the debug phase increases, requiring a greater advanced lead-time before product release. In addition, as the complexity of integrated circuits increase, it becomes necessary to fabricate more prototype iterations of the silicon (or "spins" of silicon) in order to remove successive layers of bugs from the design, thereby increasing the engineering and materials cost of the released product. It would be desirable to reduce these engineering and material costs and speed up the product cycle. Moreover, if more data, or more accurate data was available for analysis, the designers and debuggers might be able to expedite the design and debug process for the product, thereby minimizing the number of spins and the time to release the product.

One of the chief difficulties encountered during the debug phase of a product is identifying the source of an error. This can be extremely difficult because the error may make it impossible to obtain state information from the integrated circuit. For example, in a processor, an error may cause the processor to quit executing, thus making it impossible to obtain the state data necessary to identify the source of the error. As a result, the debug process requires that the debug team infer the source of the error by looking at memory accesses by the processor or patterns of activity on other external busses. The normal technique for probing external busses is to solder a wire onto a terminal or trace. Unfortunately, merely adding a soldered wire to a terminal or trace can create signal reflections, which may distort the data being monitored. Thus, the manual probing of bus terminals and traces is impractical and inaccurate, especially those attached to high speed, highly complex chips. More sophisticated techniques are also used, but are expensive and suffer, albeit to a lesser degree, from the same effects. Further, because the state information available on these busses is typically a small subset of the processor's state, the debug team must make guesses regarding the state of data internal to the processor. If the internal state of the processor could be acquired and stored, these inferences would be replaced by solid data. By reducing the designer's uncertainty and increasing the available data, this would be beneficial in solving problems with the processor hardware or software.

In certain products under development, such as new microprocessors under development by the assignee of the present invention, the number of transistors is exceedingly large and their dimensions are exceedingly small. Both of these factors make it practically impossible to probe internal terminals of the chip or internal wire traces. Moreover, to the extent that certain internal terminals and traces could be probed, the conventional methods for conducting such a probing operation are extremely expensive, and some might potentially corrupt the state of the terminals and traces being probed. Consequently, the only common technique currently available to test or probe the state of terminals and traces in highly complex chips is to route signals through the chip's external output terminals, to some external interface. This approach, however, suffers in several respects.

First, as noted above, the signals obtained from the external output terminals are removed from the signal states of the internal terminals and traces. Thus, this technique requires the debugging team to infer the state of the internal terminals and traces from signals appearing on an external bus. Second, routing the desired state to external terminals often requires more wiring, silicon, drivers, pads and power than is affordable. Attempts to do so can compromise the normal functioning of the chip. And costs escalate throughout the design, often impacting the micropackaging and system board as well as the die. Third, oftentimes the internal clock rate of the chip operates at a much higher rate than the external logic analyzers that receive and process the data. As an example, processor designs currently under development operate at clock speeds up to and exceeding 2.0 GHz. The fastest commercial logic analyzers, despite their expense, are incapable of operating at GHz frequencies. Thus, either certain data must be ignored, or some other mechanism must be employed to capture the high-speed data being generated on the chip. The typical approach is to run the chip at a slower clock speed so the data can be captured by external test equipment. This solution, however, makes it more difficult to detect the bugs and errors that occur when the chip is running at full clock speeds. Some errors that occur at full clock speed will not be detected when the clock speed is reduced to accommodate the off-chip logic analyzers. Also, increasingly the processor connects to external components that have a minimum speed, below which they will not operate. These speeds require the processor to operate faster than the external logic analyzer can accommodate.

As an alternative to sending data off-chip, attempts have been made to capture certain state data on chip, thereby reducing the problems of interfacing slower speed test equipment with high-speed devices. In this approach, history buffers, and even on-chip logic analyzers (OCLA) are provided to acquire and store event and/or time sequenced data on the chip itself. In the past, to the extent that designers sought to incorporate memory onto the chip for debug and test purposes, dedicated memory devices (usually RAM) were used. Thus, in prior art designs that attempted to capture debug and test information on-chip, a dedicated memory structure was incorporated into the chip design solely to store data for the debug and test modes. The problem with this approach, however, is that it requires the allocation of a significant amount of chip space to incorporate such dedicated memory devices, and these memory devices, while used extensively during the design and development phase of the chip, add little or nothing to the performance of the chip once it is released into production. Thus, the inclusion of dedicated memory space on the chip represents an opportunity cost, and means that functionality and/or performance is sacrificed to include this dedicated memory on the chip. Consequently, the inclusion of memory for debug purposes, while helpful in the debug and test phase, is generally viewed as undesirable because of the accompanying loss of performance and functionality that must be sacrificed. If a dedicated memory device is included on the chip, system designers normally require that such a memory be very small in size to minimize the cost increase (silicon cost is an exponential function of area, and memories are large structures), as well as the performance and functionality loss that accompanies the inclusion of such a dedicated memory. As the size of the dedicated memory becomes smaller, so too does the prospect that the state information stored in the dedicated memory will be sufficient to assist in the debug process. Thus, as the dedicated memory space becomes smaller, so too does the probability that useful debug data will be captured. In relative terms, the largest dedicated on-chip memories typically are incapable of storing very much data.

It would be desirable if a system or technique was developed that would permit the capture of more debug information to reduce cycle times, and the costs associated with designing and debugging a chip. It would also be desirable if the system was capable of acquiring data at the internal clock rate, and was capable of storing the data for subsequent retrieval and analysis. It would further be beneficial if sufficient quantities of test and debug data could be stored to increase the probability that meaningful data regarding bugs was captured. Further, it would be advantageous if the processor or chip was debuggable and diagnosable in the field, as well as in the laboratory. In particular, it would be advantageous if other problems, including errors in executing software application programs, could be detected and solved using the debug system. Such a system would permit customers and programmers to resolve software conflicts and to optimize system performance. Also, it would be desirable if the memory did not add cost to the processor and if its presence did not detract from the features or performance of the processor, at least in normal operation. Despite the apparent advantages that such a system would offer, to date no such system has been developed.

BRIEF SUMMARY OF THE INVENTION

The problems noted above are solved in large part by an on-chip logic analyzer that selectively takes ownership of one or more cache sets that are already included as part of the system design. During normal operation, the on-chip cache sets are used by the processor to enhance the performance of the system. During debug modes, one of more of the cache sets may be used as a memory for the on-chip logic analyzer. This ability to make use of the on-chip cache memory during debug modes provides the on-chip logic analyzer with a relatively large memory to store debug data, while sacrificing little or nothing in the way of system functionality or performance when the chip is operating in normal mode. Further, because processors are normally designed to operate with some defective cache sets, the effects on the processor/cache design are minimal.

According to a preferred embodiment of the present invention, an integrated processor design includes a CPU core and multiple sets of on-chip cache memory. The CPU core is capable of operating with fewer than the designed number of sets, so the CPU has the ability to operate in the absence of one or more of the cache memories provided in the system. Thus, if one (or more) of the on-chip cache sets does not yield, or is defective, the processor can still be operated effectively. According to the preferred embodiment, during debug operation, one or more of the cache sets may be placed under the control of an on-chip logic analyzer, thereby permitting the on-chip logic analyzer to store debug data in that cache set (or sets). In the event that the processor is not in a debug mode or test mode, then all of the operable on-chip cache memory sets are available for use by the CPU core.

According to an exemplary embodiment of the present invention, an integrated circuit, such as a processor, includes one or more on-chip logic analyzers that are capable of acquiring and storing internal state data, including the address of executing instructions, program counter data, and other data relating to the operation of a CPU core, at full clock speed. The processor includes a cache memory on-chip, which is configured in sets and distributed in different locations on the chip. According to the exemplary embodiment, one of the cache sets is configured to function as on-chip storage for the on-chip logic analyzers when the processor is in debug mode. If the chip is in normal operational mode, the cache set is configured to operate as a conventional memory cache for the CPU core. Preferably, the on-chip logic analyzer(s) are associated with particular segments of the cache set, based on geography (this refers to the relative arrangement of features, such as the cache, CPU core, and OCLA on the chip). According to the exemplary embodiment, the cache set is divided equally between two on-chip logic analyzers, which are capable of monitoring different operational functions of the processor. As actually implemented in the exemplary embodiment, each on-chip logic analyzer is therefore capable of storing over 16,000 lines of 64-bit wide data, thus providing a robust history log for debugging and performance testing of the integrated circuit.

According to another aspect of the present invention, a processor includes an on-chip logic analyzer that capable of gathering internal state information, filtering it, and selectively storing it on-chip. The on-chip logic analyzer selectively takes control of a portion of the on-chip cache memory, and uses that cache memory to store the internal state information. Preferably, the on-chip cache memory is configured in sets, and the on-chip logic analyzer selectively takes control of one or more of the sets to store the internal state information. The processor may comprise one processor in a multiple processor computer system, and may be capable of transmitting data to and receiving data from other processors in the system.

According to another aspect of the present invention, a processor includes an on-chip memory system, which includes at least one cache memory device accessed by a cache memory bus, which comprises an address path, a data path, and a control path. A multiplexer device selects which address, data and control signals will be routed to the cache memory set. When in a debug mode, the multiplexer selects address, data and control signals from the on-chip logic analyzer to store in the cache memory. Conversely, when the chip is operating in a normal mode, the multiplexer selects address, data and control signals from the CPU core to store in the cache memory. Other operating states may also be supported, such as an initialization mode, during which the multiplexer selects test logic as the source of address, data and control signals to store in the cache memory. Thus, by piggy-backing on the test port of the multiplexer, the on-chip logic analyzer has access to a memory bus and memory device that is as good as that which the CPU uses, without introducing any new dedicated memory devices into the chip layout, or any new timing considerations from the system perspective. Because the on-chip logic analyzer has access to a relatively large cache memory section (or sections) that are provided on the chip itself, the on-chip logic analyzer can store a relatively large quantity of state data, in an efficient manner, with a minimal design risk that the new hardware would interfere or prove incompatible with existing logic.

These and other aspects of the present invention will become apparent upon reading the detailed description of the preferred embodiment and the appended claims.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "connect", "connects", "couple" or "couples" is intended to mean either an indirect or direct connection. Thus, if a first device couples to a second device, that connection may be through a direct connection, or through an indirect connection via other devices and connections. Such connections are typically electrical, but may be via optical or other signaling methods. The terms "microprocessor," "processor," and "CPU" are all used interchangeably to refer to one or more integrated circuits that contain logic elements for manipulating data and for making decisions based on executable software. It should be understood that although the present invention is described in the context of the preferred embodiment, which is implemented as a processor, the present invention has broader application and can be used with any digital logic device that includes on-chip memory, and which must either be debugged or tested prior to release. It should also be understood that the present invention may be implemented in a single integrated circuit, or may be packaged in separate integrated circuits. Set associative organization for cache memories is a common design choice. In other cache organizations, there are other regions of the cache memory that can be removed from normal service and used for OCLA memory. For a given cache design, the extent and choice of such regions will be apparent to a cache designer of ordinary skill, once the requirements of the OCLA, disclosed herein, are fully appreciated. For ease of exposition, the terms "set" and "cache set" are used to mean a single set of an n-way set associative cache, or such other cache region as may be convenient for a given embodiment.

DETAILED DESCRIPTION OF THE PREFERRED EMBODIMENTS

Figure 1:
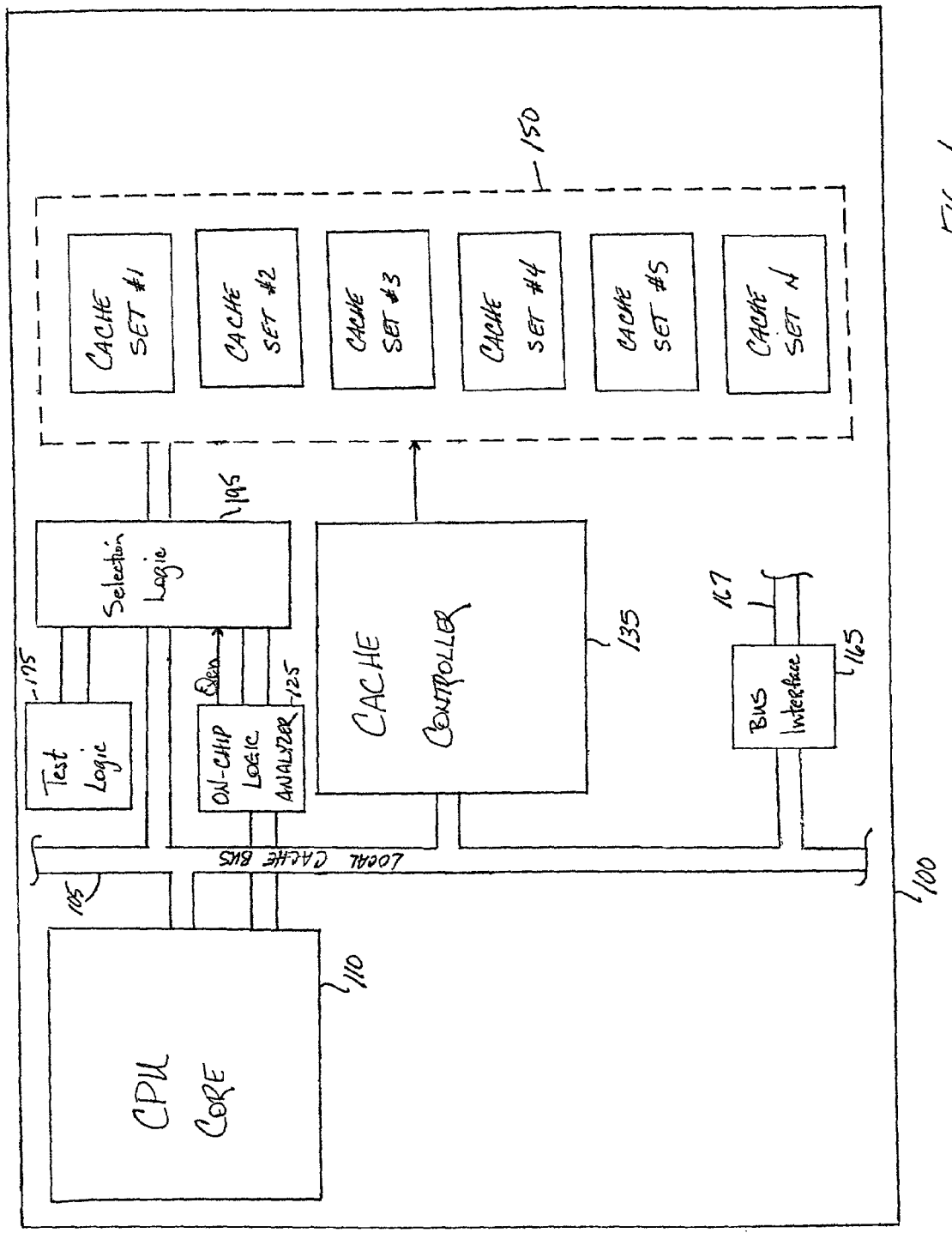
FIG. 1 shows a processor, constructed in accordance with the preferred embodiment, including an on-chip logic analyzer capable of storing data in and retrieving data from an on-chip cache memory set.

Referring initially to FIG. 1, the present invention constructed in accordance with the preferred embodiment generally comprises an integrated processor 100 that includes a CPU core 110 coupled to a cache memory 150. In accordance with normal convention, a cache controller 135 controls memory accesses to the cache memory 150. The CPU core 110, the cache controller 135 and the cache memory 150 preferably are coupled to a local cache bus 105. Other devices may also be coupled to the local cache bus 105, including a local bus interface 165 that interfaces the local cache bus 105 to a processor local bus 167. Various other devices may reside on the local bus 167, including an on-chip memory controller (not shown) that controls accesses to a system memory (not shown), and an on-chip I/O controller that controls accesses to both internal and external I/O devices. The processor 100 may be designed to operate in a multiple processor environment, and thus may be capable of transmitting signals to and receiving signals from the other processors in the system.

The cache memory 150 preferably comprises an L2 cache located on-chip, although other types of cache memory may be used. According to the preferred embodiment, the cache memory 150 is segmented into a plurality of cache sets, as previously defined. N such cache sets are shown in FIG. 1 to indicate that the number of cache sets included in the cache memory 150 may vary as desired by the system designer. In accordance with normal convention, the cache controller 135 orchestrates and manages the transfer of data between the CPU core 110, cache memory 150, and the local cache bus 105. In the preferred embodiment, each of the cache sets stores multiple lines of data, and each line of data comprises four doublewords, with each doubleword including 32 bits. Thus, each line in a cache set has 128 bits for storing data, plus any error checking and correction (ECC) bits. It should be understood, however, that the cache may be constructed with a different configuration and organization without departing from the principles of the present invention.

As is conventional, each line of cache memory has an associated address tag and state information. The address tag indicates a physical address in system memory corresponding to each entry within the cache memory 150. The state information indicates if the data stored in that cache line is valid and unmodified. The cache controller 135 manages the address tag and state information for the data stored in the cache sets, and performs various caching functions that are well-known to those skilled in the art.

As shown in FIG. 1, the processor 100 includes an on-chip logic analyzer (OCLA) 125 specifically designed to facilitate the debugging of the processor both during the design and development phase, and during use in the field by customers. Thus, according to the preferred embodiment, the OCLA 125 includes logic for more efficiently debugging the chip hardware and any software that is executing on the processor. Although shown in the block diagram of FIG. 1 as being located within a single location, it should be understood that the logic for OCLA 125 (and other logic shown in FIG. 1) may be distributed throughout the chip.

Referring still to FIG. 1, the OCLA 125 preferably receives data regarding the state of various hardware devices, and the execution of software instructions in the CPU core 110. Thus, according to the preferred embodiment, the OCLA 125 may couple to the local bus 165, the CPU core 110, and other logic within the processor. Preferably, the OCLA 125 receives data regarding the execution of program instructions by the CPU core 110. As an example, the OCLA 125 may receive data from the CPU core 110, which indicates the address of instructions executing in the CPU core 110.

According to the preferred embodiment, the OCLA 125 preferably is capable of filtering the state data it receives from the CPU core 110 and other logical devices internal to the processor 100, and of selecting the data that it wishes to store. The OCLA 125 may include various logical units that permit the OCLA 125 flexibility in filtering and selecting useful data, in a manner analogous to an external logic analyzer.

If the OCLA 125 is in the debug or test mode, the OCLA 125 (or other logic) preferably transmits an OCLA enable signal ($Q_{en}$) to a selection logic 195 indicating that the processor 100 is in a debug mode. In accordance with the present invention, when in the debug mode, the data selected by the OCLA 125 is stored in one or more of the cache sets in the cache memory 150. The OCLA 125 may halt the storage of data into the cache memory, or may read data from the cache memory. The OCLA and associated logic are capable of reading the data from the cache memory to a register that can be addressed by the processor, or optionally an external device, such as another processor, or an external logic analyzer. According to the preferred embodiment, the OCLA 125 is associated with a particular cache set (or sets), and thus when the processor is in a debug mode, the only data stored in that particular cache set (or sets) will be data from the OCLA 125. Thus, in the preferred embodiment, activating the OCLA for data storage disables a predetermined cache set(s) for normal memory data. As will be apparent to one skilled in the art, this reservation of a cache set during debug mode can be implemented in a number of ways, but preferably the cache controller 135 receives a signal ($Q_{en}$) from the OCLA 125 claiming ownership of that cache set. In response to receiving the $Q_{en}$ signal, the cache controller will not store CPU data in that particular cache set. When the processor 100 is not in a debug mode, then the cache controller can store CPU data in any functioning cache set, including the cache set that is used by the OCLA during debug mode. As one skilled in the art will appreciate, switching Qen while the system is operational has implications similar to those of dynamically adding or removing cache or memory. (So-called "hot add/remove.") It should be noted that the well-known strategies for dealing with these implications apply here.

According to the preferred embodiment, in addition to being able to support a debug mode, the cache memory 150 and cache controller 135 also are capable of supporting an initialization mode, in which test logic 175 probes the cache memory 150 during system initialization to determine which of the cache sets are operative. If a cache set is found to be bad by the test logic, then a flag bit will be set in an associated configuration register, and the cache controller will never permit data to be stored in that defective cache set. If the cache set designated for use by the OCLA 125 is found to be inoperative by the test logic 175, then preferably the system is indicated to be defective since it will not support the debug mode. Thus, in addition to debug mode and normal CPU mode, the processor also preferably supports a test or initialization mode.

In accordance with the preferred embodiment, the OCLA 125 has three major modes: (1) disabled; (2) acquisition; and (3) idle. When disabled, the OCLA cannot acquire data, and most of its resources may be used for other purposes. As noted above, when the OCLA 125 is disabled, all of the operable cache sets may be used for normal memory operations. In acquisition mode, the OCLA 125 acquires internal processor state as data, and stores selected state data in the pre-selected cache memory set(s). In the idle mode, the OCLA cannot acquire data, but data stored in the cache set(s) may be read.

Figure 2:
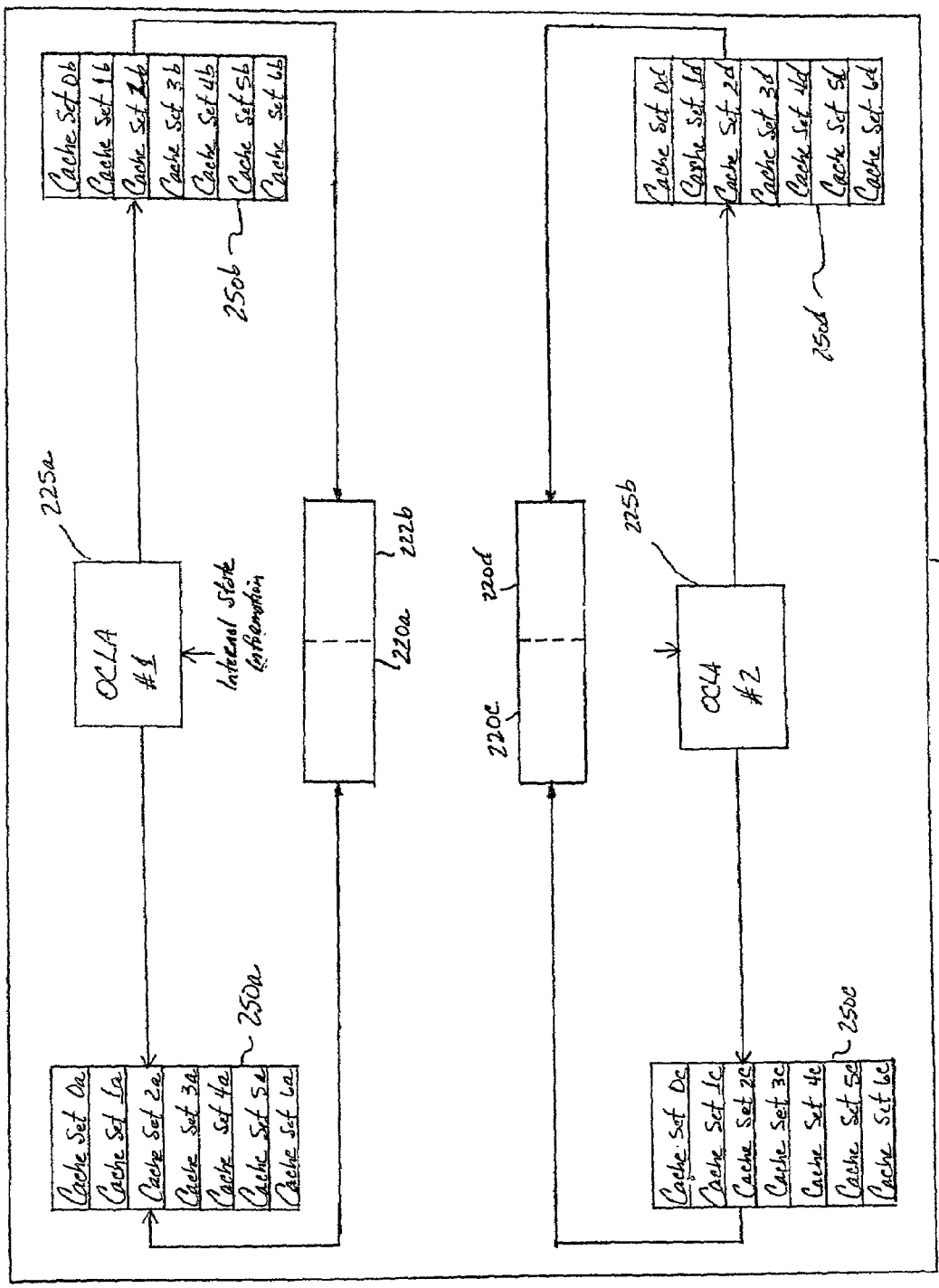
FIG. 2 shows an integrated circuit with two on-chip logic analyzers and a cache memory that is split into quadrants.

Referring now to FIG. 2, and in accordance with an exemplary embodiment, two on-chip logic analyzers (OCLAs) 225a and 225b are provided in an integrated circuit 75, which may comprise a processor or other digital logic device. According to the exemplary embodiment, each of the OCLAs 225a and 225b are responsible for monitoring different aspects of the integrated circuit's operation and functionality. As an example, if the integrated circuit comprises a processor, OCLA 225a may be responsible for monitoring the cache, while OCLA 225b may monitor the program counter data. Preferably, each of the OCLAs is capable of receiving data from multiple sources. The OCLAs 225a and 225b may be programmed with different filters, and may be capable of using different parameters to select the data to be stored as part of the debug mode. According to the exemplary embodiment, each of the OCLAs 225a and 225b are capable of storing up to 16,384 entries of 64-bit data in an associated acquisition memory, which is comprised of all or part of one or more cache sets. It will be understood that the size of the memory is arbitrary, and thus the present invention is not limited to any particular memory size or type.

Whether either or both of the OCLAs are enabled or disabled is programmable. When the OCLAs are enabled, one or more of the cache sets that normally holds data for the integrated circuit is disabled from normal use, and its memory is re-allocated to the OCLAs as acquisition memory. As shown in the exemplary embodiment of FIG. 2, each OCLA has access to ½ of the cache set that is disabled for use by the OCLAs. Thus, in this embodiment each OCLA can store up to 16,384 entries, each of which contains 64 data bits.

As shown in the exemplary embodiment of FIG. 2, the cache memory 250 is divided into seven cache sets, which are identified as cache sets (0–6). Each cache set preferably is configured in four quadrants, which have been identified in FIG. 2 as 250a, 250b, 250c, 250d. Each quadrant preferably is capable of storing 32 bits of data (or one doubleword). Thus, a line of data (which is 128 bits wide) is distributed in each of the four quadrants. It should be understood by one skilled in the art that the number of cache sets, the size of the cache set, the width of a cache line, or the manner in which the cache lines and/or sets are distributed in the integrated circuit are not intended to be a limiting factor of the present invention.

In the exemplary embodiment of FIG. 2, one or more cache sets are pre-selected as reserved for use by the OCLA during the debug mode. According to the preferred embodiment, the cache set where OCLA data will be stored is predetermined, so that the OCLA bus lines can be routed to only that cache set. If desired, however, the OCLA bus lines could be routed to each of the cache sets to provide greater flexibility in selecting cache sets for storage of OCLA data, or to provide more storage than a single set permits. In the embodiment of FIG. 2, cache set 2 has been identified as the cache set in which OCLA data is stored during a debug mode of operation. According to this exemplary embodiment, two of the four quadrants of cache set are associated with a particular OCLA. Thus, as shown in the embodiment of FIG. 2, OCLA 225a stores selected debug data in quadrants a and b of the cache memory set 2 (in other words, in cache set 2a and cache set 2b). Similarly, OCLA 225b stores selected debug data in quadrants c and d of cache memory set 2 (i.e., in cache sets 2c and 2d). The association of an OCLA with a particular quadrant preferably is made based on geographical location on the semiconductor die to minimize the length of the wires. The configuration shown in FIG. 2 permits two OCLAs to operate simultaneously and monitor different functional aspects of the processor, and to store selected data in a 64 bit wide format in the two associated quadrants of the designated cache set (which are each 32 bits wide, plus the error checking and correction (ECC) bits). The nature of the interface is that OCLA writes can execute independently of normal cache activity. Thus, each of the OCLAs 225a and 225b are capable of storing selected historical data reflecting the functioning of various aspects of the processor in existing cache memory sets, without the necessity of including a dedicated memory cell and without concerns about the speed or integrity of the memory device. When the processor is not in debug mode, then the cache sets can be used for normal CPU core operation.

Referring still to FIG. 2, preferably a read register is provided to facilitate the reading of OCLA data from the cache set. Thus, as shown in FIG. 2, each of the quadrants of cache set 2 are selectively coupled to a read register 220, where the data from the cache set can be transferred during a read operation. As shown in FIG. 2, the read register may also be fragmented into 32 bit wide segments 220a–d, or may be contained in a single location. In the preferred embodiment, two read registers are provided that each have a 64-bit width, for storing data read from two cache sets. It should be understood that the size and number of the read registers is not intended to be a limiting factor of the present invention.

Figure 3A:
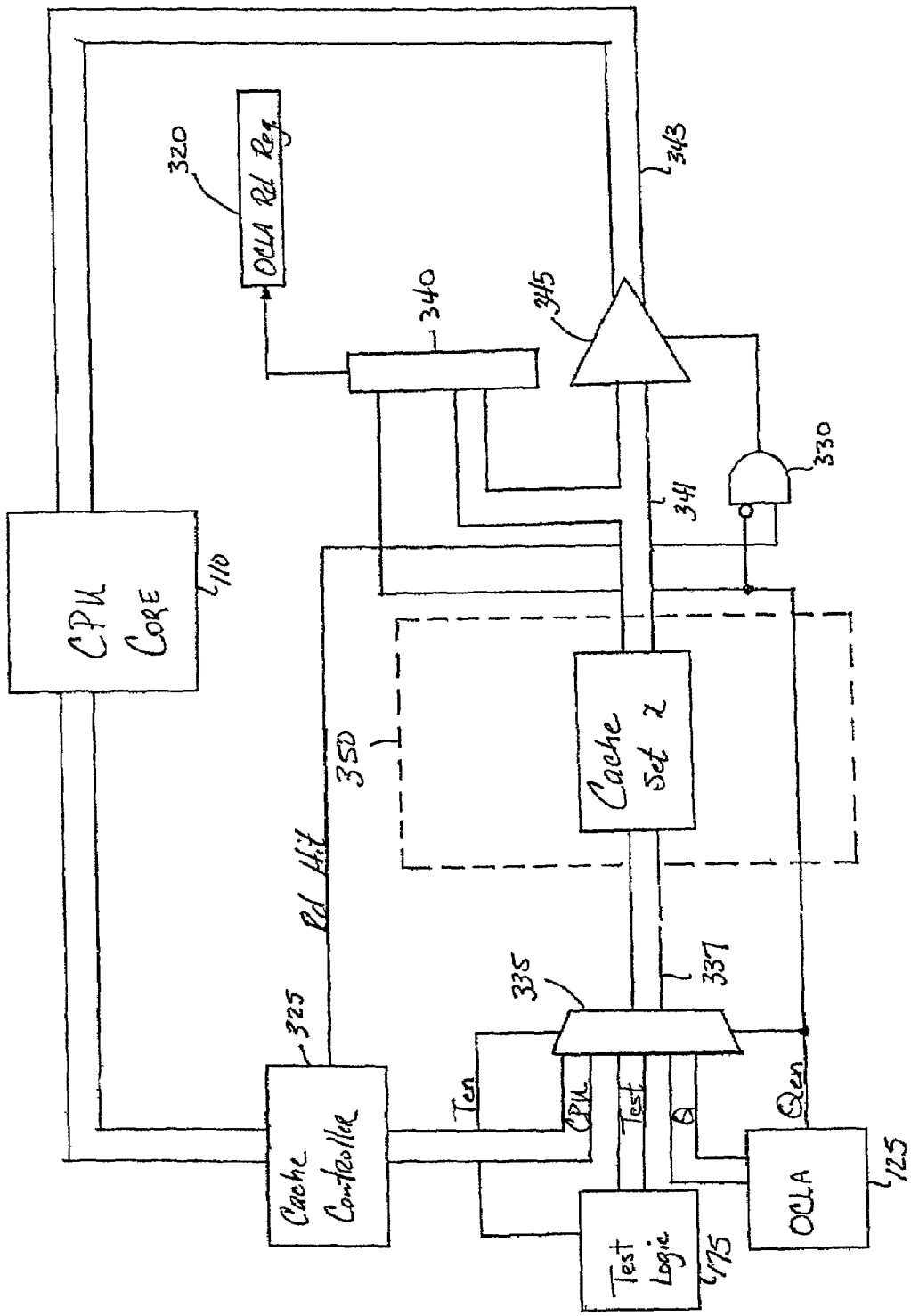
FIG. 3A shows an exemplary implementation of circuitry used to store and access data in the cache memory section of FIG. 1.
Figure 3B:
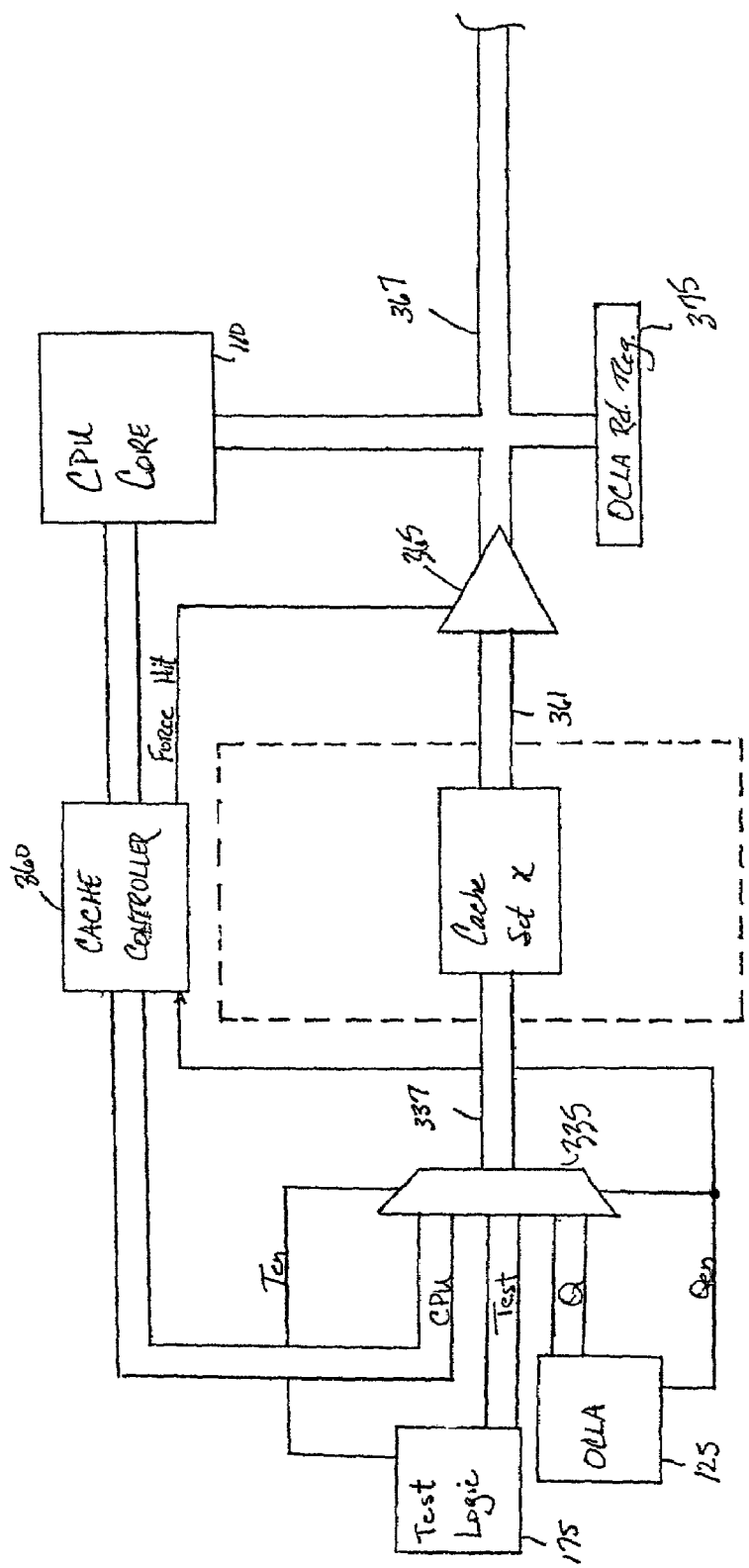
FIG. 3B shows a preferred implementation of circuitry used to store and access data in the cache memory section of FIG. 1.

Referring now to FIGS. 3A and 3B, two different implementations are depicted to illustrate the manner in which OCLA data is written to and read from a cache set. It should be understood that these implementations are not intended to be exhaustive, and many other implementations may be practiced without departing from the spirit of the invention. In both of these implementations, a single OCLA has been shown for ease of illustration, with the understanding that multiple OCLAs could be provided, if desired.

One embodiment for selectively connecting the OCLA 125 to a cache set is shown in FIG. 3A. According to the embodiment of FIG. 3A, the cache controller 325, test logic 175, and the OCLA 125 couple via different bus lines to the cache memory 350. As noted above, the OCLA 125 may couple to only a subset of all the cache sets to minimize the number of traces that must be included on the chip. In the following discussion, cache set x has been pre-selected to operate either as a cache set for the CPU core 110 during normal processor operation, or as the OCLA's acquisition memory during debug mode. In addition, FIG. 3A assumes that the cache set x can be tested for operability by suitable test logic 175. Thus, as shown in FIG. 3A, a separate CPU bus (CPU), Test bus (Test), and OCLA bus (Q) couple to cache set x, which forms part of the processor on-chip cache 350. According to the exemplary embodiment of FIG. 3A, each of these busses connect to a multiplexer 335 or similar logic, which selects one of the bus lines to connect to cache set x. The multiplexer may be implemented as part of the cache controller or the cache memory itself, or may comprise a separate, discrete logic device. The multiplexer 335 preferably receives two enable input signals, test enable ($T_{en}$) and OCLA enable ($Q_{en}$). According to the preferred embodiment, the multiplexer 335 is configured to select the OCLA bus (Q bus) bus if the $Q_{en}$ signal is asserted. If the $Q_{en}$ is not asserted, but the test enable signal $T_{en}$ is asserted, then the multiplexer 335 selects the Test bus for connection to cache set x. If neither the test enable signal ($T_{en}$) or the OCLA enable ($Q_{en}$) signal are asserted, then the multiplexer 335 connects the CPU bus to the cache set x. The following truth table illustrates the operation of the multiplexer 335:

TABLE 1

| $Q_{en}$ | $T_{en}$ | Bus selected |
|---|---|---|
| 1 | X | Q bus |
| 0 | 1 | Test |
| 0 | 0 | CPU |

The X indicates a don't care state, so that regardless if $T_{en}$ is high or low, the multiplexer will select the Q bus. It is preferable that the mechanism for controlling the $Q_{en}$ signal be such that the chip's reset or initialization sequence has a means to prevent its deassertion. According to the preferred embodiment, if the $Q_{en}$ signal is found to be asserted during a Reset operation (other than power-up), then the test logic 175 will not test cache set x, so that the OCLA data and control registers are not disturbed. During power-up, or if the $Q_{en}$ signal is not asserted, then cache set x is tested. This ensures that, for example, should the processor cease executing instructions or fail to respond to an attention interrupt, it is still possible to extract the acquired state after a reset.

As one skilled in the art will appreciate, the CPU, Test and Q busses may be consolidated into a single bus if suitable arbitration logic is provided to determine which of the test logic, OCLA and CPU will be permitted access to the bus. In such an instance, the priority scheme set forth in Table I also preferably defines the arbitration scheme to be implemented. If implemented in this fashion, care should be exercised to prevent the logic analyzer from disturbing the system under test.

Referring still to FIG. 3A, the bus selected by multiplexer 335 connects to the cache memory input bus 337, which connects to the cache controller 325 and the cache set x. In accordance with normal convention, the memory input bus and the source busses include conventional address, data and control signals for completing a cache memory transaction.

Referring still to the exemplary embodiment of FIG. 3A, the manner in which OCLA data is read out of the cache set x will now be described. During normal memory operation (when $Q_{en}$ is low) data is read our of cache set x whenever a Read Hit (Rd Hit) signal is issued by the cache controller 325, indicating that a memory read request on internal cache bus 337 matches the tag bits of a line of memory stored in the cache set x. In addition, the cache set x drives out the requested data onto the memory output bus 341. The Read Hit signal enables an output driver 345, which causes the requested data stored in the cache set x to be driven on the cache output bus 343, where it can be read by the CPU core 110. It should be noted that the cache output bus 343 may use the same wires as the CPU cache input bus.

When in debug mode, however, the $Q_{en}$ signal goes high, which causes AND gate 330 to stay low, and thus output driver 345 is disabled, and no data can be driven onto the cache output bus 343. Thus, when the OCLA is enabled, cache set x cannot drive data onto the cache output bus 343. This permits normal cached memory references to execute in parallel with and undisturbed by the OCLA access. In the embodiment of FIG. 3A, when the cache set x is disabled, only the OCLA 125 can write to it, and only the OCLA Read Register 320 can read from cache set x. The OCLA Read Register 320 preferably forms part of the OCLA 125. The OCLA Read Register 320 preferably comprises a specialized I/O device that can be addressed by the CPU, and optionally other devices to access the OCLA data read from the cache set x. The address for the OCLA Read register preferably is non-cacheable.

The OCLA 125 reads data from cache set x by transmitting the desired address for the OCLA data to the cache memory 350, which causes the data to be available on the memory output bus 341. Because the cache set x is disabled, the data is not driven out onto the cache output bus 343. The $Q_{en}$ signal, when asserted, enables register 340, which preferably comprises a parallel-to-serial shift register. Thus, when the $Q_{en}$ signal is asserted, data driven out of the cache set x is captured in register 340. The data in register then is transferred serially over a single wire to the OCLA Read Register 320, which is an addressable register that can then be subsequently accessed via conventional techniques. Consequently, the stored OCLA data can be read a piece at a time from the cache set x by the OCLA. The advantage of this configuration is that few changes are required to the cache array and cache controller. The serial transmission method eliminates the need to route the (often wide) bus 341 to register 340 when they are distant from each other, as is often the case.

Referring now to FIG. 3B, an alternative configuration for reading OCLA data out of the cache set x will now be described. The embodiment of FIG. 3B is preferred because it permits the output lines of the cache set x to be used to load the data directly into an OCLA Read register 375 without requiring the data to be converted into a serial data stream. As shown in FIG. 3B, the data source is selected by multiplexer 335, in the same manner as described above in FIG. 3A. However, instead of adding another output data path, and requiring data to be serialized before loading into the OCLA Read Register, the embodiment of FIG. 4 permits the same output data path to be used, and further enables the data from the cache set to be loaded in parallel fashion into the OCLA Read Register.

According to the preferred embodiment, OCLA memory is assigned a range of addresses that are serviced by the cache, even though they are classified as non-cacheable, and the OCLA operates like an I/O register in that its data is not sourced from or copied back to system memory. Preferably, the data stored in OCLA memory (i.e., cache set x when the OCLA is enabled) is not subject to any coherence protocols and cannot be the subject of a speculative reference. According to the preferred embodiment, the OCLA memory addresses are given an I/O space non-cacheable address, but those addresses are routed to the cache memory. Routing the OCLA address range to the cache memory, however, will not be sufficient to drive out the data because the address will not match any address tags in the cache controller, unless the address tags associated with cache set x are loaded in the cache controller and maintained as valid at all times so that the cache controller cannot invalidate or evict the data.

As an alternative to maintaining the cache tags and status information in the cache controller, a simpler approach is to coerce the cache controller into issuing a "force hit"—that is, to schedule a read of a line of cache set x even though the cache controller does not detect a cache hit and/or the data in that line of cache set x is believed to be invalid. The force hit can be generated either internally by the cache controller, or can be generated externally and delivered to the cache controller. Thus, the OCLA could deliver a sideband signal to the cache controller that accompanies an OCLA memory address which indicates that a force hit is required, or the cache controller may be configured to detect a cache cycle specifying an OCLA memory address range, and issue the force hit internally. Other implementations will be apparent to one skilled in the art.

FIG. 3B shows an embodiment in which the cache controller internally generates the force hit signal to drive out a line of data in the cache set x in response to receiving and detecting a request to read data addressed with an OCLA address range. As shown in FIG. 3B, the cache controller 360 receives memory cycles on the CPU bus, and issues a hit signal to output driver 365 if requested data resides in the cache set x. The output driver 365 connects to the output lines of the cache set x and functions to drive out a line of data from the cache set x if the memory access matches the address of data stored in that cache set. According to the embodiment of FIG. 3B, the OCLA Read Register 375 connects to the output lines of the output driver 365, and preferably responds to a range of addresses that is sufficient to cover the OCLA data stored in the cache set. Alternatively, it may respond to a smaller range of addresses, accessing the entire set via a pointer register or similar mechanism. The cache controller 360 receives the OCLA enable signal $Q_{en}$, which identifies when the processor is in debug mode. When the $Q_{en}$ signal is asserted, the cache controller 360 knows that cache set x is reserved for the OCLA. If $Q_{en}$ signal is asserted and an access is made to a cacheable I/O address range that is reserved for the OCLA data, the cache controller 360 issues a force hit to the output driver 365, and causes the data in the cache memory set x to be driven onto the cache output bus 367, even though the address was to an I/O range. The OCLA Read Register 375, which forms part of the OCLA 125, may latch in the data driven onto the bus by the output driver 365, or preferably, simply pass it to the requester in the customary fashion for a memory reference satisfied by a cache hit. If desired, the OCLA Read Register may be eliminated in the embodiment of FIG. 3B, with data being routed directly to the device requesting the data from cache set x.

Figure 4:
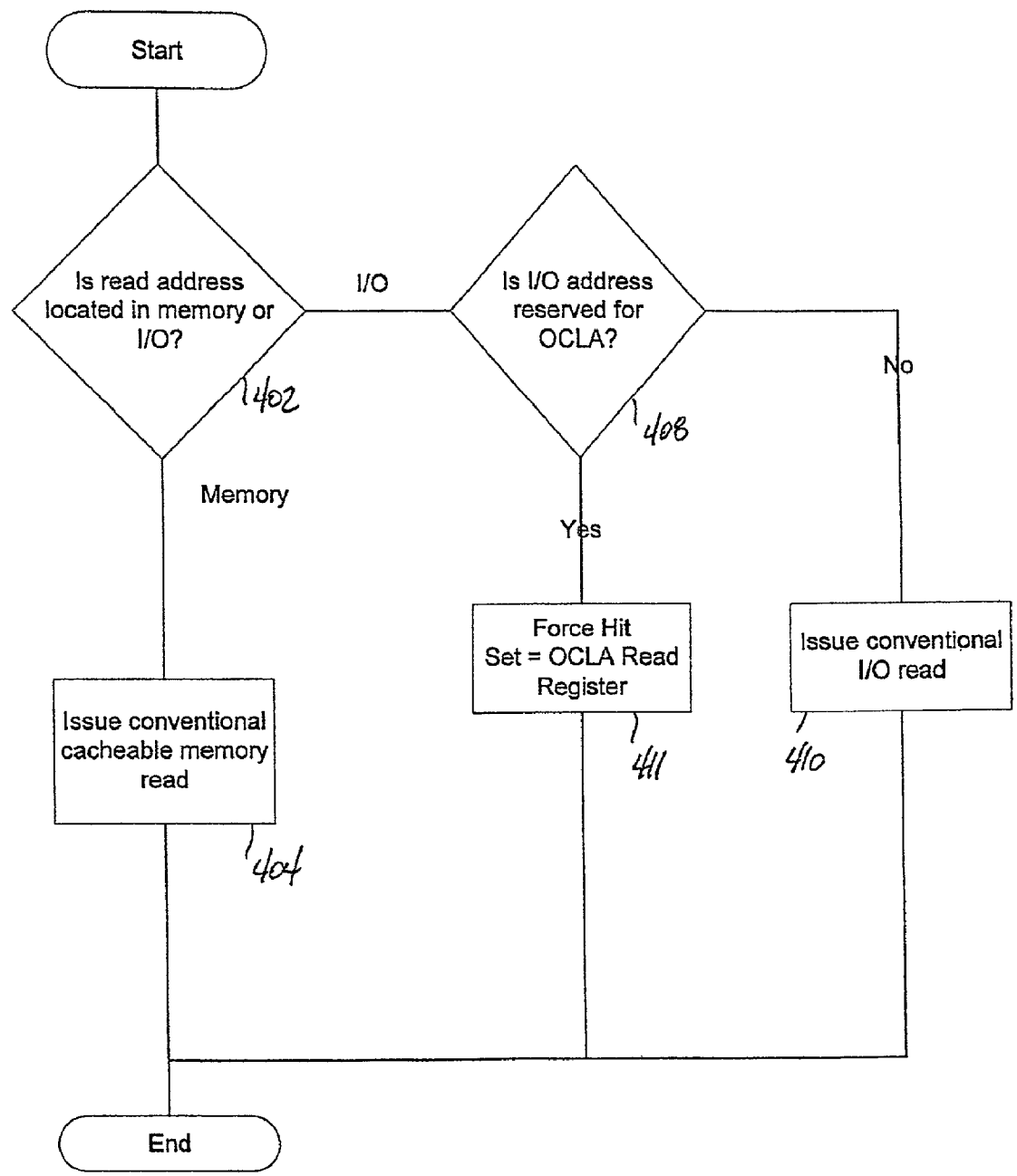
FIG. 4 is a flow chart depicting the method by which data is retrieved from the embodiment of FIG. 3B.

Referring to FIGS. 3B and 4, the operation of the preferred embodiment for reading data from the cache memory set will now be described. When the cache controller 360 receives a read request, it determines in step 402 if the read request is to an address that is located in memory space or in I/O space. If the address is within the memory address range, the cache controller in step 404 determines if the requested address matches an address that currently resides in the cache memory. If so, the cache controller 360 issues a cache hit, and the addressed data is retrieved from cache memory 350. If no address tags in the cache controller match the requested address, then the cache controller issues a cache miss and the data is retrieved from system memory.

If the requested data is directed to an address that is not in a memory address range, the cache controller in step 408 determines if the address is to an address range reserved for OCLA data. If it is, then in step 411, the cache controller issues a force hit, which causes the cache set x to drive out a specified portion of its data in parallel to the requesting device. If the address is not to an address range for OCLA data, then the cache controller ignores the read request, and other logic in the processor processes the read request in conventional fashion, as shown in step 410. This process can be repeated until the contents of the cache set x have been completely read. By using the existing bus structure, and reading the data out in parallel, the bandwidth for reading out OCLA data is increased significantly over that shown in FIG. 3A, with very little additional wiring.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit fabricated on a chip, comprising: an on-chip logic analyzer a cache memory that includes a plurality of cache sets; at least one on-chip logic device that stores data to said plurality of cache sets during normal operation; and a logic gate that receives an enable signal when the on-chip logic analyzer is enabled, and which disables at least one of said plurality of said cache set for storing data from said on-chip logic analyzer; wherein the integrated circuit comprises a processor, and the on-chip logic device includes a CPU core; wherein the enable signal is generated by the on-chip logic analyzer; wherein the logic comprises a multiplexer that connects the on-chip logic analyzer to the disabled cache set when the on-chip logic analyzer asserts the enable signal; wherein the multiplexer forms part of a cache controller.

2. The integrated circuit of claim 1, wherein the on-chip logic analyzer receives information regarding internal state data of the processor and selects some of the received information for storage in the disabled cache set.

3. The integrated circuit of claim 2, further comprising a second on-chip logic analyzer that receives information regarding instructions executing in the processor, and wherein the second on-chip logic analyzer selects at least some of said received information for storage in the disabled cache set.

4. The integrated circuit of claim 3, wherein the disabled cache set is sub-divided into multiple portions, and said on-chip logic analyzer and said second on-chip logic analyzer are each assigned a portion of said disabled cache set.

5. The integrated circuit of claim 1, further comprising a cache controller that couples to said cache memory and which controls accesses to said cache memory, and wherein data stored by the on-chip logic analyzer is assigned an address range, and said cache controller forces a hit on said disabled cache set when a read request is made to the address range assigned to the on-chip logic analyzer.

6. The integrated circuit of claim 1, wherein data stored by the on-chip logic analyzer is assigned an address range, and said disabled cache set makes available at least a portion of the data stored therein when a read request is made to the address range assigned to the on-chip logic analyzer.

7. The integrated circuit of claim 6, wherein the on-chip logic analyzer includes an addressable read register that receives data stored in the disabled cache set in response to a read request to an address range assigned to the on-chip logic analyzer.

8. A processor comprising: a CPU core; a cache memory coupled to said CPU core; said cache memory including a plurality of cache sets that during normal operation store data written by the CPU core; and at least one logic analyzer that receives information relating to the internal state of the processor, said logic analyzer being coupled to at least one of said plurality of cache set; and wherein said logic analyzer is capable of gaining ownership of said at least one cache set to store selected portions of said received information when said on-chip logic analyzer is enabled; wherein data stored by the logic analyzer is assigned an address range, and said at least one cache set makes available at least a portion of the data stored therein when a read request is made to the address range assigned to the logic analyzer.

9. The processor of claim 8, further comprising a multiplexer that couples to said CPU core via a first bus and which couples to said logic analyzer via a second bus, and wherein said multiplexer selects either said first bus or said second bus to connect to said at least one cache set.

10. The processor of claim 9, wherein said multiplexer receives an enable signal indicating whether to connect said first bus or said second bus to said at least one cache set.

11. The processor of claim 9, wherein the logic analyzer is located on-chip.

12. The processor of claim 9, wherein said multiplexer couples to test logic via third bus, and wherein said multiplexer selects one of said first bus, said second bus, or said third bus to connect to said at least one cache set.

13. The processor of claim 12, wherein said multiplexer receives a first enable signal from said logic analyzer and a second enable signal from said test logic, and wherein said multiplexer selects which of said first, second or third bus to connect to said at least one cache set based on the status of said first and second enable signals.

14. The processor of claim 13, wherein said multiplexer awards priority to said logic analyzer if said logic analyzer requests access to said at least one cache set.

15. The processor of claim 8, wherein the logic analyzer includes an addressable read register that receives data stored in the at least one cache set in response to a read request to an address range assigned to the on-chip logic analyzer.

16. A processor fabricated on a chip comprising: a cache memory divided into a plurality of cache sets; test logic coupled to said cache memory, which tests the cache sets during system initialization and determines which cache sets are operative; a cache controller that controls the storage and retrieval of data from said cache memory, with said cache controller only storing data to cache sets that are determined to be operative by the test logic; a CPU core coupled to said cache memory, said CPU core storing data to all operative cache sets during normal operation; an on-chip logic analyzer capable of receiving data reflecting the internal state of the processor, said on-chip logic analyzer coupled to at least one cache set, which is disabled from use by the CPU core when the on-chip logic analyzer is enabled; wherein the on-chip logic analyzer is capable of issuing a read request to the cache controller for data stored in the disabled cache set, which includes a signal indicating that the cache controller should force a hit on the disabled cache set.

17. The processor of claim 16, wherein data stored by the on-chip logic analyzer is assigned an address range, and said cache controller forces a hit on said disabled cache set when a read request is issued to the address range assigned to the on-chip logic analyzer.

18. The processor of claim 17, wherein the on-chip logic analyzer includes an addressable read register that receives data stored in the disabled cache set in response to the read request to an address range assigned to the on-chip logic analyzer.

19. A method of maintaining state data of a processor in a cache memory set, comprising the acts of: enabling an on-chip logic analyzer to receive and select data for storage; disabling a cache set from use by any device other than the on-chip analyzer; storing said selected data in the disabled cache set; further comprising the acts of: reading said selected data from said disabled cache set; and storing said data read from the disabled cache set to an addressable register.

20. The method of claim 19, wherein the act of disabling the cache set includes transmitting an enable signal to a multiplexer that selects the on-chip logic analyzer as the sole source of data to be written to the cache set.

21. The method of claim 19, wherein the act of reading selected data includes: issuing a read request to an 1/0 address reserved for on-chip logic analyzer data; recognizing the read request as targeting on-chip logic analyzer data; routing the read request to the cache memory; and forcing a hit on the disabled cache set.

22. The processor of claim 13, wherein said test logic will preserve the contents of at least one said cache set during a reset operation if said first enable signal is asserted.

* * * * *

UNITED STATES PATENT AND TRADEMARK OFFICE
CERTIFICATE OF CORRECTION

PATENT NO.        : 7,051,239 B2                                          Page 1 of 4
APPLICATION NO. : 10/034717
DATED             : May 23, 2006
INVENTOR(S)       : Timothe Litt It is certified that error appears in the above-identified patent and that said Letters Patent is hereby corrected as shown below:

The title page should be deleted and substitute therefore the attached title page.

Sheet 1 of 5 – Drawings
Fig. 1, replace with the following figure:

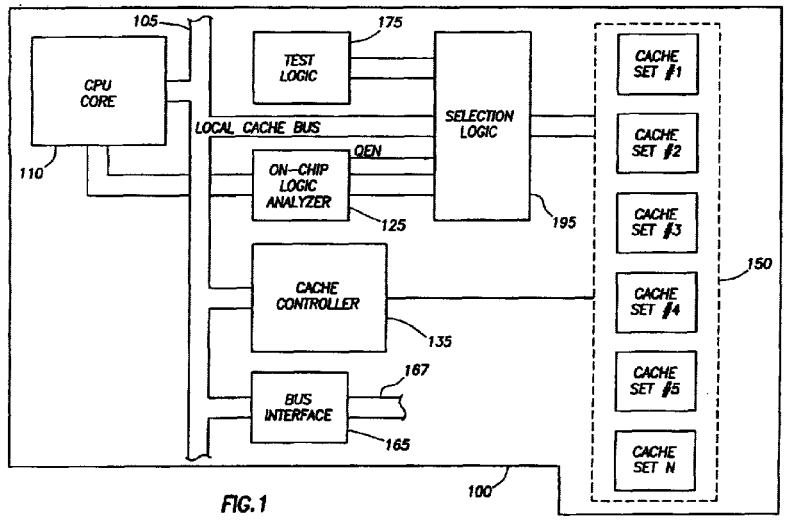

Sheet 2 of 5 – Drawings
Fig. 2, replace with the following figure:

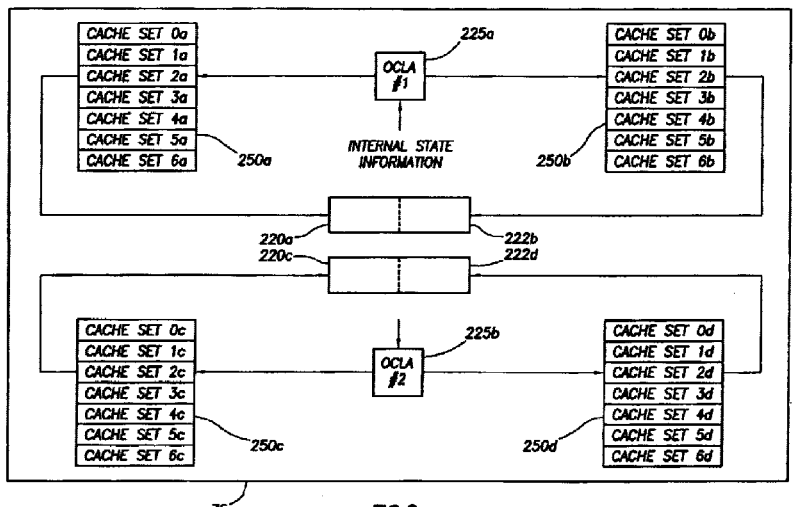

UNITED STATES PATENT AND TRADEMARK OFFICE
CERTIFICATE OF CORRECTION

PATENT NO. : 7,051,239 B2
APPLICATION NO. : 10/034717
DATED : May 23, 2006
INVENTOR(S) : Timothe Litt Page 2 of 4

It is certified that error appears in the above-identified patent and that said Letters Patent is hereby corrected as shown below:

Sheet 3 of 5 – Drawings
Fig. 3A, replace with the following figure:

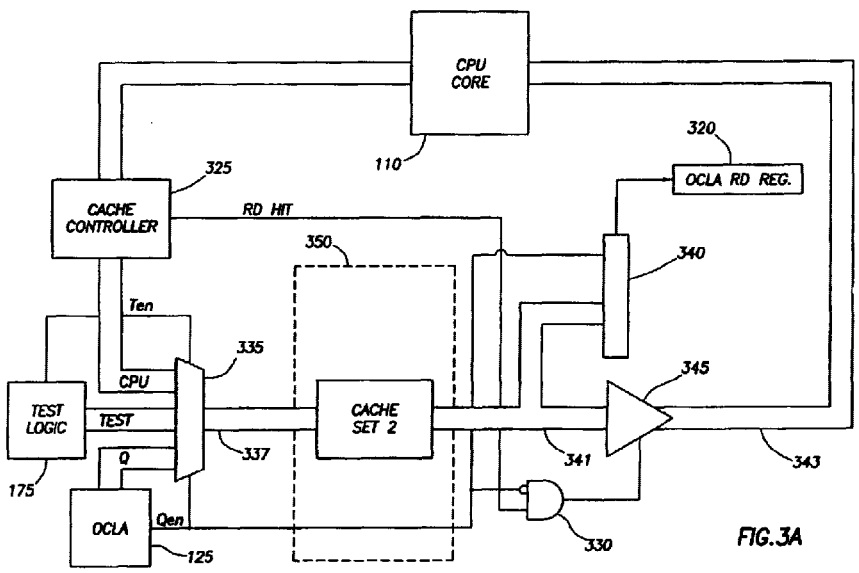

Sheet 4 of 5 – Drawings
Fig. 3B, replace with the following figure:

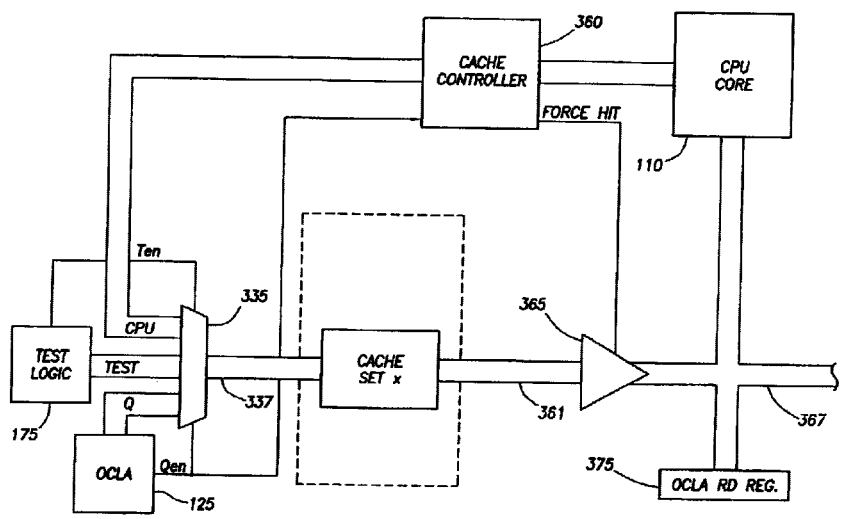

UNITED STATES PATENT AND TRADEMARK OFFICE
CERTIFICATE OF CORRECTION

PATENT NO.        : 7,051,239 B2
APPLICATION NO.   : 10/034717
DATED             : May 23, 2006
INVENTOR(S)       : Timothe Litt It is certified that error appears in the above-identified patent and that said Letters Patent is hereby corrected as shown below:

Sheet 5 of 5 – Drawings
Fig. 4, replace with the following figure:

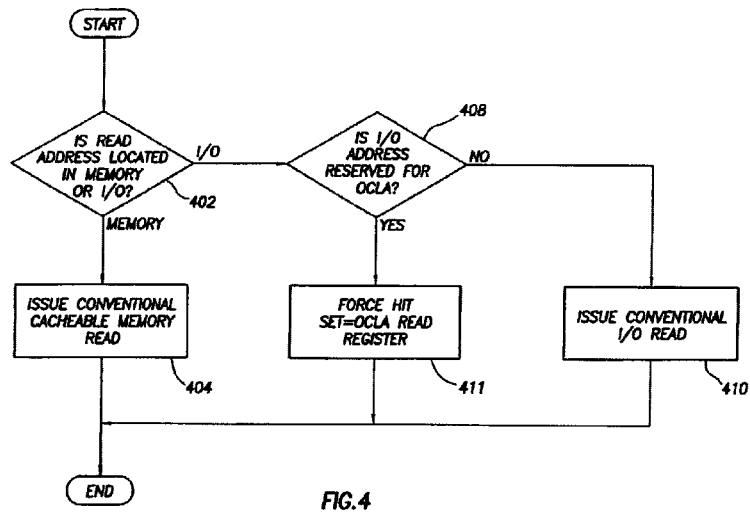

FIG.4

Signed and Sealed this

Fifth Day of December, 2006

JON W. DUDAS
*Director of the United States Patent and Trademark Office*

(12) United States Patent
Litt

(10) Patent No.: US 7,051,239 B2
(45) Date of Patent: May 23, 2006

(54) METHOD AND APPARATUS FOR EFFICIENTLY IMPLEMENTING TRACE AND/OR LOGIC ANALYSIS MECHANISMS ON A PROCESSOR CHIP

(75) Inventor: Timothe Litt, Southborough, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 658 days.

(21) Appl. No.: 10/034,717

(22) Filed: Dec. 28, 2001

(65) Prior Publication Data

US 2003/0126508 A1 Jul. 3, 2003

(51) Int. Cl.
*G06F 11/00* (2006.01)
(52) U.S. Cl. ............................ 714/42; 714/30; 714/33; 714/41
(58) Field of Classification Search ................. 714/30, 714/33, 42, 41
See application file for complete search history.

(56) References Cited

U.S. PATENT DOCUMENTS

| | | |
|---|---|---|
| 6,618,775 B1 * | 9/2003 | Davis ........................ 710/100 |
| 6,704,895 B1 * | 3/2004 | Swoboda et al. ........... 714/726 |
| 6,742,145 B1 * | 5/2004 | Bailey et al. ................ 714/42 |
| 6,772,369 B1 * | 8/2004 | Smith et al. ................. 714/31 |

* cited by examiner

*Primary Examiner*—Scott Baderman
*Assistant Examiner*—Timothy M Bonura

(57) ABSTRACT

A system is disclosed in which an on-chip logic analyzer (OCLA) is included in an integrated circuit, such as a microprocessor. During debug modes, one or more sets of an on-chip cache memory are disabled from use by other circuitry in the integrated circuit, and reserved exclusively for use by the OCLA. Data stored in the reserved cache set can then be read out by the OCLA, and placed in a register that can be accessed by other logic internal or external to the integrated circuit. If the integrated circuit is operating under normal mode, the cache memory set can be used in conventional fashion by other circuitry with in the integrated circuit to enhance performance.

22 Claims, 5 Drawing Sheets

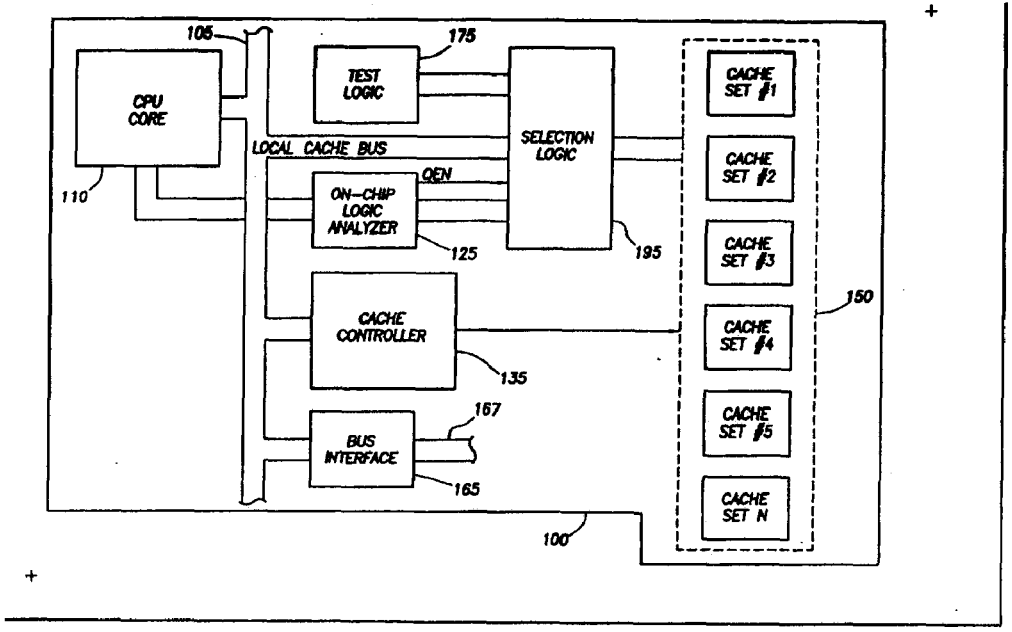

UNITED STATES PATENT AND TRADEMARK OFFICE
CERTIFICATE OF CORRECTION

PATENT NO.         : 7,051,239 B2
APPLICATION NO. : 10/034717
DATED              : May 23, 2006
INVENTOR(S)        : Timothe Litt It is certified that error appears in the above-identified patent and that said Letters Patent is hereby corrected as shown below:

In column 14, line 57, in Claim 15, delete "claim 8" and insert -- claim 4 --, therefor.

In column 16, line 14, in Claim 21, delete "1/0" and insert -- I/O --, therefor.

Signed and Sealed this

First Day of September, 2009

David J. Kappos
*Director of the United States Patent and Trademark Office*